United States Patent [19]

Chapek et al.

[11] Patent Number: 5,846,888
[45] Date of Patent: *Dec. 8, 1998

[54] METHOD FOR IN-SITU INCORPORATION OF DESIRABLE IMPURITIES INTO HIGH PRESSURE OXIDES

[75] Inventors: David L. Chapek; Randhir P. S. Thakur, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 721,838

[22] Filed: Sep. 27, 1996

[51] Int. Cl.⁶ .................................................. H01L 21/316
[52] U.S. Cl. ........................... 438/770; 438/769; 438/774
[58] Field of Search ...................................... 437/239, 240; 438/770, 774, 769

[56] References Cited

U.S. PATENT DOCUMENTS

| | | | |
|---|---|---|---|
| 4,167,915 | 9/1979 | Toole et al. | 118/708 |
| 4,268,538 | 5/1981 | Toole et al. | 427/93 |
| 4,275,094 | 6/1981 | Takagi et al. | 427/93 |
| 4,293,589 | 10/1981 | Takagi et al. | 427/93 |
| 4,293,590 | 10/1981 | Takagi et al. | 427/93 |
| 5,043,224 | 8/1991 | Jaccodine et al. | 438/774 |
| 5,167,716 | 12/1992 | Boitnott et al. | 118/719 |
| 5,167,717 | 12/1992 | Boitnott | 118/724 |
| 5,232,604 | 8/1993 | Swallow et al. | 210/759 |
| 5,264,396 | 11/1993 | Thakur et al. | 437/238 |
| 5,322,807 | 6/1994 | Chen et al. | 437/40 |
| 5,344,787 | 9/1994 | Nagalingam et al. | 437/35 |
| 5,405,533 | 4/1995 | Hazlebeck et al. | 210/634 |
| 5,466,625 | 11/1995 | Hsieh et al. | 437/52 |
| 5,467,424 | 11/1995 | Davies et al. | 392/401 |
| 5,474,955 | 12/1995 | Thakur | 437/173 |
| 5,494,852 | 2/1996 | Gwin | 438/774 |
| 5,504,029 | 4/1996 | Murata et al. | 437/52 |
| 5,512,513 | 4/1996 | Machida et al. | 437/195 |
| 5,523,247 | 6/1996 | Wright | 437/34 |
| 5,523,249 | 6/1996 | Manzur et al. | 437/43 |
| 5,528,062 | 6/1996 | Hsieh et al. | 257/298 |
| 5,552,332 | 9/1996 | Tseng et al. | 437/41 |
| 5,571,734 | 11/1996 | Tseng et al. | 437/40 |
| 5,624,865 | 4/1997 | Schuegraf et al. | 438/770 |

FOREIGN PATENT DOCUMENTS

| | | |
|---|---|---|
| 53-073072 | 6/1978 | Japan . |
| 60-098640 | 6/1985 | Japan . |
| 2-042725 | 2/1990 | Japan . |
| 5074762 | 3/1993 | Japan . |

OTHER PUBLICATIONS

Wang, Xie–Wen, "Pre–Oxidation Fluorine Implantation into Si" J. Electrochem. Soc., vol. 139, No. 1, (Jan. 1992), pp. 238–241.

Lee, Hong, *Fundamentals of Microelectronics Processing*, McGraw–Hill, New York, 1990, pp. 285–287.

Wolf, Stanley, *Silicon Processing for the VLSI Era*, vol. 1, Lattice Press; Sunset Beach, CA; (1986) pp. 308–311.

*Primary Examiner*—Charles L. Bowers, Jr.
*Assistant Examiner*—Matthew Whipple
*Attorney, Agent, or Firm*—Schwegman, Lundberg, Woessner & Kluth, P.A.

[57] ABSTRACT

A desirable impurity, such as reactive gases and inert gases, is safely introduced into a substrate/oxide interface during high pressure thermal oxidation. Desirable impurities include chlorine, fluorine, bromine, iodine, astatine, nitrogen, nitrogen trifluoride, and ammonia. In one embodiment, the desirable impurity is introduced into a processing chamber prior to the high pressure oxidation step. Then, the temperature is brought to or maintained at an oxidation temperature. In another embodiment, the desirable impurity is introduced into the processing chamber after the high pressure oxidation step, while the temperature is still sufficiently high for oxidation. In yet another embodiment, the desirable impurity is introduced into the processing chamber both before and after the high pressure oxidation step.

21 Claims, 4 Drawing Sheets

METHOD FOR IN-SITU INCORPORATION OF DESIRABLE IMPURITIES INTO HIGH PRESSURE OXIDES

FIELD OF THE INVENTION

The present invention relates to methods and apparatus for manufacturing semiconductor structures, and in particular, for forming oxide interfaces in such structures.

BACKGROUND OF THE INVENTION

The introduction of desirable impurities into a silicon/oxide interface during thermal oxidation is an accepted and common practice. For example, chlorine, fluorine, and other halides are commonly introduced during processing. Addition of the impurity into an oxide interface has several beneficial effects on the oxide. For example, the addition typically getters mobile ions, reduces fixed oxide charge, reduces fixed interface charge, reduces the number of oxide defects, decreases oxide viscosity to decrease encroachment during LOCOS (LOCal Oxidation of Silicon) isolation applications, improves oxide growth rate, improves the silicon/oxide interface quality, increases minority carrier lifetimes in the silicon substrate, and reduces substrate crystal damage (e.g. stacking faults).

The introduction of such desirable impurities into a high pressure processing furnace has only been done in low pressure environments due to impurity carrier gas delivery difficulties and safety concerns. To date, this problem has limited the application of such desirable impurities into oxide interfaces, when using HiPOx. Thus, there is a need for a safe method of introducing desirable impurities into an oxide interface in conjunction with HiPOx.

SUMMARY OF THE INVENTION

The present invention teaches a method for safely introducing desirable impurities into an oxide interface during high pressure thermal oxidation. For example, a reactive gas or inert gas, such as chlorine, fluorine, bromine, iodine, astatine, nitrogen, nitrogen trifluoride, and/or ammonia are introduced into the oxide interface in the embodiments of the invention.

In one embodiment, a desirable impurity is introduced into a processing chamber prior to the high pressure oxidation step. Then, the temperature is brought to or maintained at an oxidation temperature and the high pressure oxidation step is performed.

In another embodiment, a desirable impurity is introduced into the processing chamber after the high pressure oxidation step. However, during introduction of the desirable impurity, the temperature is still sufficiently high for oxidation.

In yet another embodiment, a desirable impurity is introduced into the processing chamber prior to the high pressure oxidation step. Then, the temperature is brought to or maintained at an oxidation temperature and the high pressure oxidation step is performed. After the high pressure oxidation step, the pressure is reduced. A desirable impurity is then introduced again into the processing chamber while the temperature is still sufficiently high for oxidation.

Using the method of the invention, desirable impurities are able to be safely introduced into oxide interfaces. By introducing the desirable impurity into the system at a low pressure, high pressure oxides are able to benefit from the introduction of such impurites, as are their counterpart low pressure oxides.

DESCRIPTION OF THE EMBODIMENTS

Figure 1A:
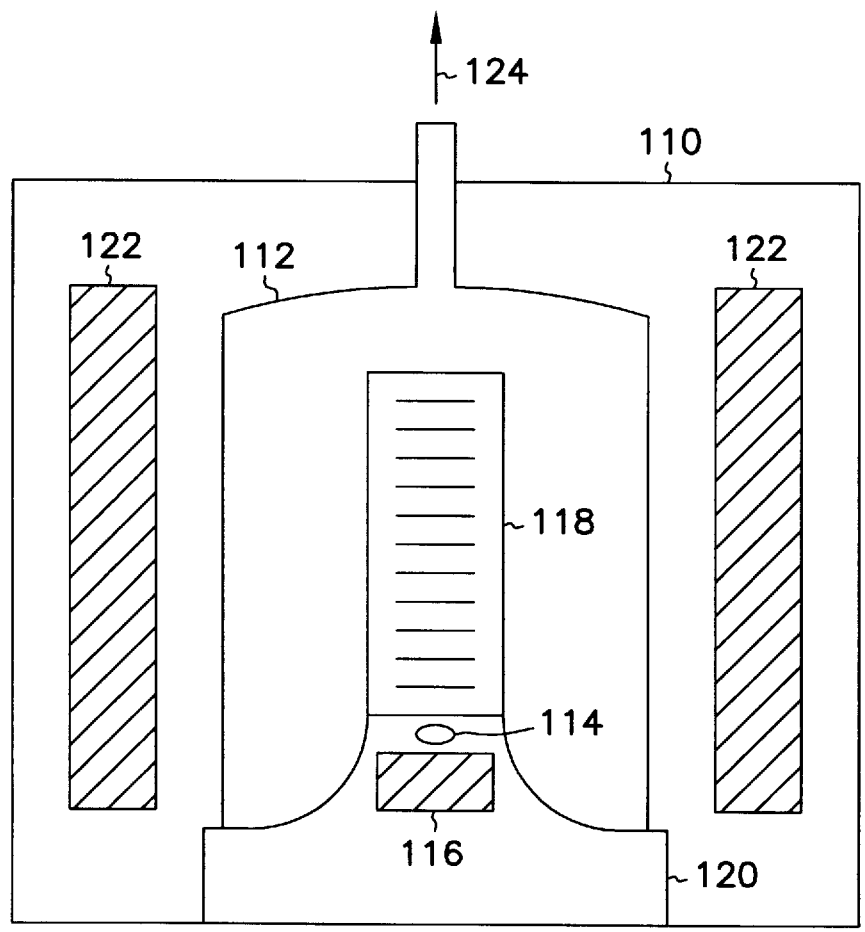
FIG. 1A is a schematic diagram of a closed prior art pressure vessel used in the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

It is advantageous to use high pressure oxidation (HiPOx) for oxide growth on various substrates, including semiconductor, dielectric, and metallic materials, all with or without additional layers of material. HiPOx improves oxide growth rates and oxide characteristics for thermal oxidation processes. However, it has been difficult to safely introduce certain species into such high pressure environments for inclusion in oxide films. This invention is applicable to any HiPOx system using any oxidizing ambient. For example, dry or wet oxygen ($O_2$), nitrous oxide ($N_2O$), nitric oxide (NO), or any other oxidizing ambient is used with the method of this invention.

The invention is also applicable to the incorporation of any desirable impurity into a substrate/oxide interface during an oxidation process. Such desirable impurities include reactive gases, such as bromine (Br), chlorine (Cl), fluorine (F), iodine (I), and astatine (At). Further desirable impurities include inert gases, such as nitrogen (N), nitrogen trifluoride ($NF_3$), and ammonia ($NH_3$). The following examples are illustrated with reference to the introduction of chlorine into the interface. Using this invention, oxide interfaces are created, having reactive gas impurity concentrations of approximately $10^{17}$ to $10_{20}$ reactive gas atoms/cc, preferably in the range of $10^{18}$ to $10^{19}$ reactive gas atoms/cc. However, inert gases and other reactive gases are all incorporated into the interface using the method of this invention.

At least one substrate is placed in a processing chamber. The substrate is selected from semiconductor, dielectric, and metallic materials. A desired impurity is introduced into the substrate prior to application of high pressures in a GaSonics, Inc. vertical high pressure (VHP) furnace 110, a schematic of which is shown in prior art FIGS. 1A and 1B, or any other high pressure furnace, such as a GaSonics, Inc. HiPOx furnace. The GaSonics, Inc. VHP furnace is limited to high pressures of approximately 360 psi. However, higher oxidation pressures can be used when using different furnaces, which are capable of oxidizing at higher pressures. In general, high pressure is defined as anything greater than approximately one atmosphere. Nitrogen and oxygen are introduced into the processing chamber 112 at high pressures in single-contained lines at the gas inlet 114, after being preheated (if desired) by plug heaters 116. However, reactive source gases, such as chlorine source gases, are often acidic and must be introduced into the processing chamber 112 at lower pressures and in double-contained lines, for safety concerns. The pressure at which such source gases are introduced is limited by the equipment. For the current GaSonics, Inc. VHP furnace, such source gases must be introduced into the processing chamber 112 at pressures of approximately 10 to 100 psi, most reasonably 50 psi, after closing the base 120 of the processing chamber 112, as shown in the open position in FIG. 1B, and sealing off the wafers 118.

Figure 1B:
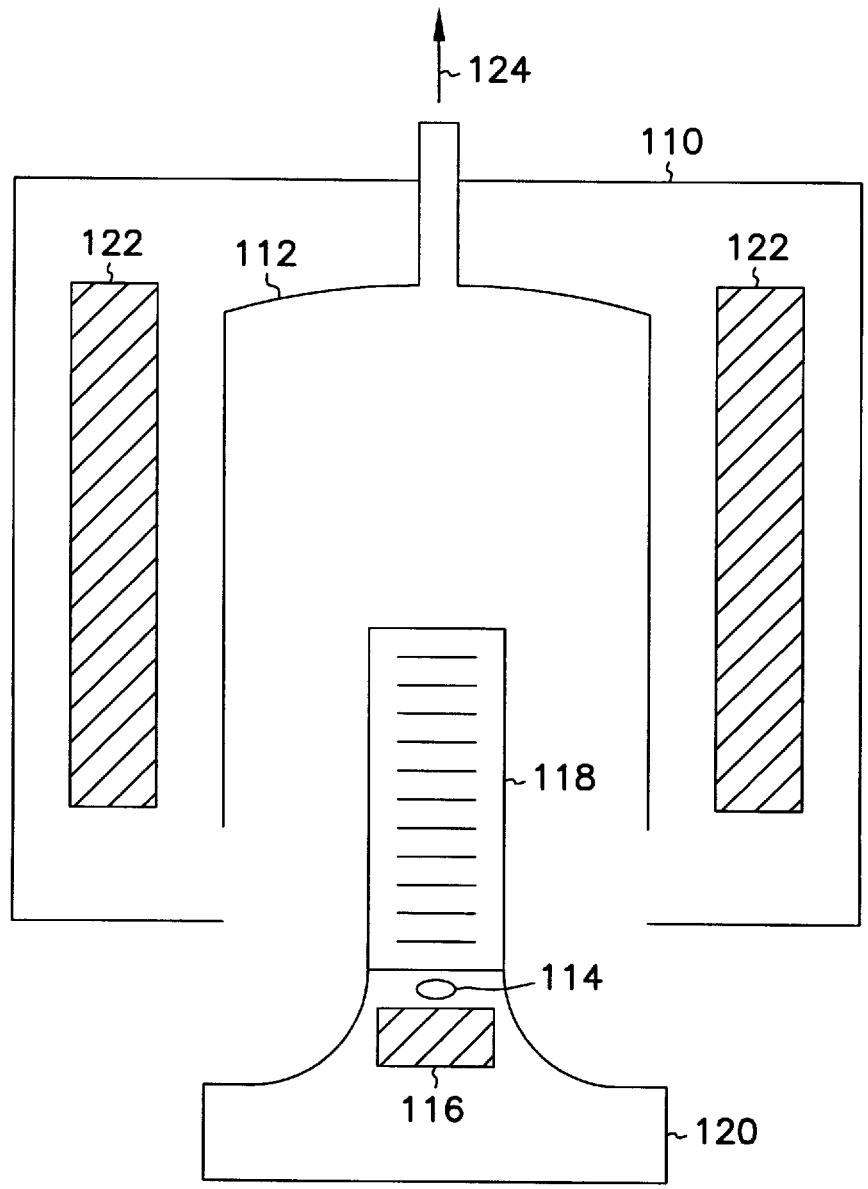
FIG. 1B is a schematic diagram of an open prior art pressure vessel used in the present invention.

In one embodiment, for the introduction of chlorine into the interface during a pre-pressure in-situ chlorination step, a chlorine source gas is provided. This step occurs prior to application of high pressure. It is not necessary for the pre-pressure chlorination step to be performed in the same furnace as subsequent high pressure oxidation. However, the same furnace, like the GaSonics, Inc. VHP, can easily be used because the processing chamber 112, as shown in FIG. 1A, is isolated from the pressure vessel 110. Chlorine source gases comprise: hydrochloric acid (HCl), trichloroacetic acid (TCA), and dichloroethylene (DCE), and other chlorine-containing source gases. When incorporating impurities other than chlorine, source gases are adjusted accordingly.

Figure 2A:
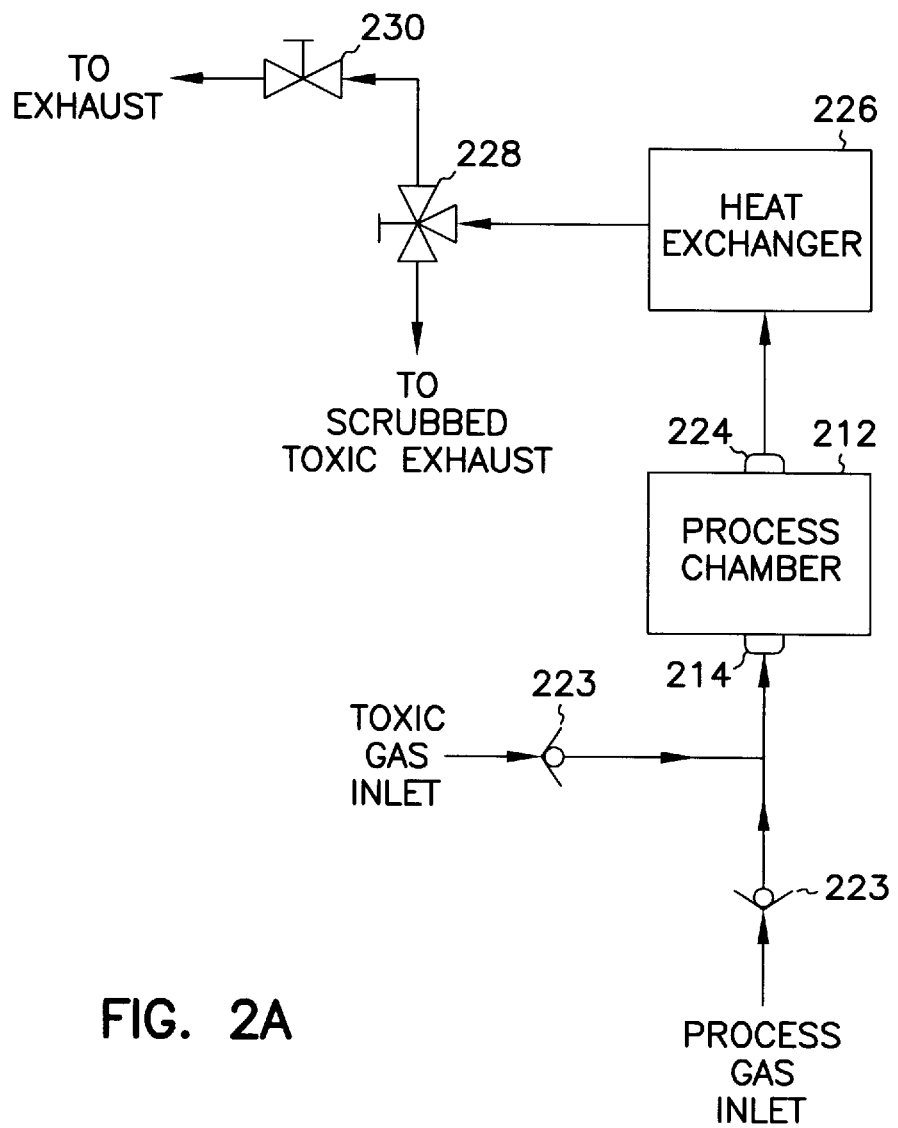
FIG. 2A is a schematic diagram of one embodiment of the gas flow used in the present invention.
Figure 2B:
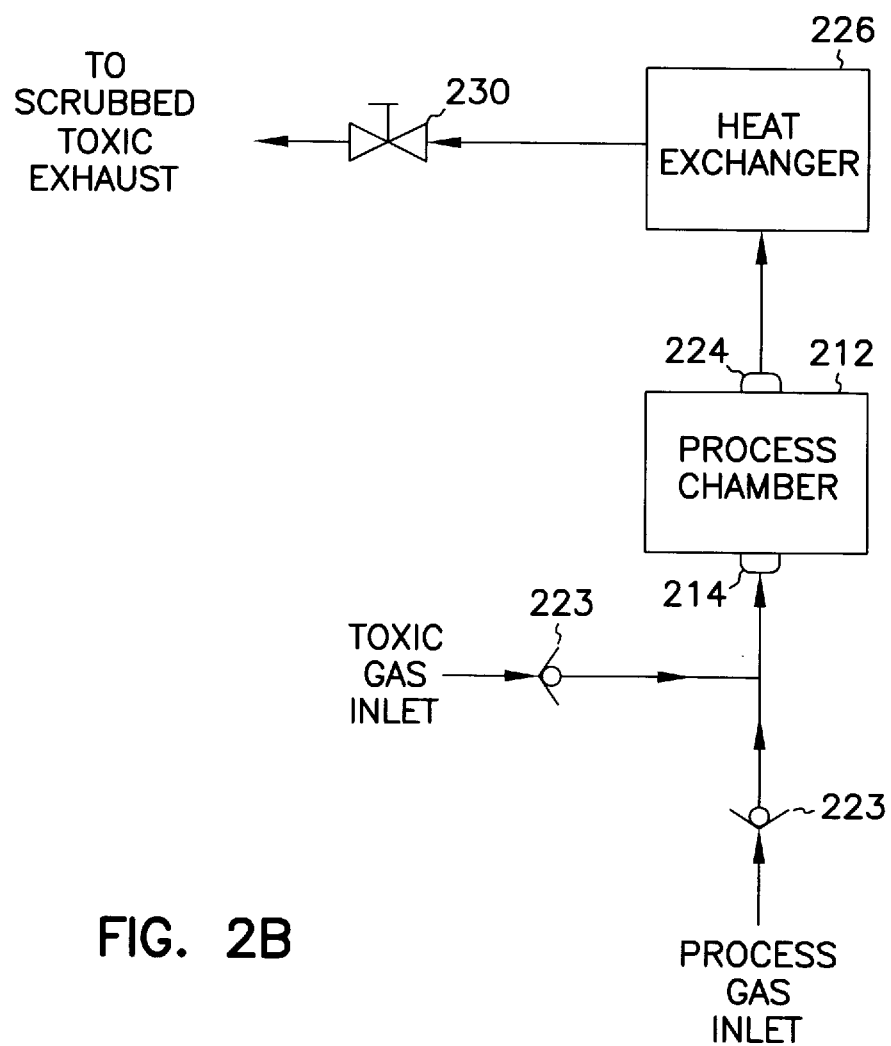
FIG. 2B is a schematic diagram of a second embodiment of the gas flow used in the present invention.

As detailed by the process flow diagram in FIG. 2A, the chlorine source gas is introduced through a check valve 223 and the gas inlet 114, as shown in FIG. 1A, into the oxidizing ambient at low pressure, such as at or near atmospheric pressures (approximately 10 to 100 psi). FIG. 2A illustrates a flow diagram for a processing chamber pressure at or near atmospheric pressure, where all of the processing chamber gas does not need to be directed through a linear control valve 230 prior to exiting the system. FIG. 2B illustrates a flow diagram for a processing chamber pressure that is not at or near atmospheric pressure, where all of the processing chamber gas must be directed through a linear control valve 230 prior to exiting the system.

It is desirable to have a chlorine (or other reactive gas) concentration of approximately 0.5 to 5 percent by volume in the processing chamber 112 ambient, and preferably chlorine concentrations of 1 to 3 percent by volume. However, when inert gases are used, concentrations of approximately up to 100 percent by volume in the processing chamber 112 ambient are used.

The temperature at which the chlorine source gas is introduced into the oxidizing ambient is not critical to the practice of the invention, but it can be preheated using the plug heaters 116, as shown in FIG. 1A. From this point, the temperature is brought to the desired oxidation temperature, if necessary, using heaters 122 spaced along the sides of the processing chamber 112 within the pressure vessel 110. The oxidation temperature depends on the type of oxide being formed, among other variables, and ranges between approximately 600 to 1,100 degrees Celsius. For example, when thin gate oxides are formed using HiPOx, lower temperatures suffice to form the oxide. However, when thicker oxides, such as field oxides, are formed using HiPOx, higher temperatures are required to form the oxide.

Then, in one embodiment, the substrate is oxidized at low pressure, such as at or near atmospheric pressure (10 to 100 psi). Any type of substrate material can be used in this invention, selected according to the desired application. For example, semiconductor, dielectric, and metallic substrates can be used.

In another embodiment, the substrate is oxidized during a pressure ramp. The upper limits for the furnace pressure are determined by the gas delivery pressure and operational safety regulations. In the case of a GaSonics, Inc. VHP furnace, the upper pressure limit is approximately 360 psi.

In another embodiment, the desired impurity is introduced through the check valve 223 and gas inlet 114, as shown in FIGS. 1A, 2A, and 2B, after application of high pressures. For the introduction of chlorine into the interface during a post-pressure in-situ chlorination step, a chlorine source gas is provided, as in the first embodiment. Once high pressure oxidation of the substrate is nearly complete, the chamber 112 pressure is reduced, while the temperature is kept sufficiently high to achieve oxidation. After the pressure has been reduced to a low pressure, such as at or near atmospheric pressure (10 to 100 psi), the chlorine source gas is introduced into the chamber 112. Oxidation is continued in the presence of the chlorine source gas, at such lower pressures, to incorporate chlorine into the oxide near the silicon/oxide interface. In another embodiment, this post-pressure chlorination step is a separate thermal step from the HiPOx thermal step and it is performed in a separate furnace.

In yet another embodiment of the invention, a desirable impurity is introduced both before and after the high pressure oxidation step. In this embodiment of the invention, desirable impurities are incorporated as previously described, depending on the relation to the high pressure step.

Subsequent to reacting at or near atmospheric pressure in the process chamber 212, as shown in FIG. 2A, the gases exit through a gas outlet 224, where they flow through a heat exchanger 226 to be cooled. Then, the gases flow through a 3-way valve 228, which scrubs the toxic exhaust (i.e., that containing HCl, TCA, DCE, or other acidic reactant gases) while flowing such exhaust at low pressure. The scrubbed toxic exhaust then exits the system. The remainder of the gas then flows through a linear control valve 230, which controls downstream pressure. That gas then exits the system through an exhaust outlet.

However, subsequent to reacting at a pressure other than at or near atmospheric pressure in the process chamber 212, as shown in FIG. 2B, the gases exit through a gas outlet 224, where they flow through a heat exchanger 226 to be cooled. Then, the gases flow through a linear control valve 230, which controls downstream pressure. That gas then exits the system through a scrubbed toxic exhaust outlet.

By utilizing the above methods, desirable impurities are incorporated into a high pressure oxide by introducing the impurity into the processing chamber at a pressure consistent with the processing chamber and the type of impurity being introduced. Processing chambers utilized in the invention can be either single wafer chambers or batch wafer processing chambers. The desirable impurity is incorporated into the oxide interface as a function of processing chamber pressure, varying depending on the substrate. Each method utilizes the steps of oxidizing at high pressure, incorporating an impurity at low pressure, and heating at least after incorporating the impurity. The methods differ by the sequence of the above steps. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for introducing an impurity into an oxide supported by a substrate, comprising the steps of:
    selecting an impurity from the group consisting of chlorine, fluorine, bromine, iodine, astatine, nitrogen trifluoride, and ammonia;
    oxidizing the substrate at high pressure to form the oxide;
    incorporating the impurity into the oxide at a low pressure of 50 to 100 psi, wherein the oxidizing step comprises a higher pressure than the incorporating step; and
    heating the substrate at least after incorporating the impurity.

2. The method of claim 1, wherein the heating step occurs at approximately 600 to 1,100 degrees Celsius.

3. A method for introducing an impurity into an oxide supported by a substrate, comprising the steps of:
    oxidizing the substrate at high pressure to form the oxide;
    incorporating an impurity, selected from the group consisting of chlorine, fluorine, bromine, iodine, astatine, nitrogen trifluoride, and ammonia, into the oxide at low pressure of approximately 50 to 100 psi after oxidizing the substrate at high pressure, wherein the oxidizing step comprises a higher pressure than the incorporating step; and
    heating the substrate to approximately 600 to 1,100 degrees Celsius at least after incorporating the impurity.

4. A method for introducing an impurity into an oxide supported by a substrate, comprising the steps of:
    incorporating an impurity, selected from the group consisting of chlorine, fluorine, bromine, iodine, astatine, nitrogen trifluoride, and ammnonia, into the substrate at low pressure of approximately 50 to 100 psi; and
    oxidizing the substrate at high pressure after incorporating the impurity, wherein the oxidizing step comprises a higher pressure than the incorporating step.

5. The method of claim 4, wherein the oxidizing step comprises heating the substrate to approximately 600 to 1,100 degrees Celsius.

6. A method for introducing an impurity into an oxide, comprising the steps of:
    selecting an impurity from the group consisting of chlorine, fluorine, bromine, iodine, astatine, nitrogen triflouride, and ammonia;
    placing at least one substrate in a processing chamber;
    flowing the impurity into the processing chamber at a pressure of greater than 50 psi;
    flowing an oxidizing ambient into the processing chamber;
    heating the processing chamber to a temperature sufficiently high to initially oxidize the substrate; and
    increasing the pressure in the processing chamber above 100 psi to further oxidize the substrate after flowing the impurity.

7. The method of claim 6, wherein the impurity is flowed at a pressure of approximately 50 to 100 psi.

8. The method of claim 6, wherein the impurity is a reactive gas and the impurity is flowed into the processing chamber to obtain an impurity concentration in the chamber of approximately 0.5 to 5 percent by volume.

9. The method of claim 6, wherein the impurity is a reactive gas and the impurity is flowed into the processing chamber to obtain an impurity concentration in the chamber of approximately 1 to 3 percent by volume.

10. The method of claim 6, wherein the processing chamber temperature is approximately 600 to 1,100 degrees Celsius to oxidize the substrate.

11. The method of claim 6, wherein the processing chamber pressure is ramped upwards during initial oxidation.

12. A method for introducing an impurity into an oxide, comprising the steps of:
    selecting an impurity from the group consisting of chlorine, flourine, bromine, iodine, astatine, nitrogen trifluoride, and ammonia;
    placing at least one substrate in a high pressure processing chamber;
    oxidizing the substrate in the high pressure processing chamber under high pressure of greater than 100 psi and at an oxidizing temperature;
    decreasing the pressure in the processing chamber,
    flowing the impurity into the processing chamber at a pressure of 50 to 100 psi, to incorporate the impurity at the interface between the substrate and oxide.

13. The method of claim 12, wherein the processing chamber pressure is approximately 50 psi when flowing the impurity.

14. The method of claim 12, wherein the impurity is a reactive gas and the impurity is flowed into the processing chamber to obtain an impurity concentration in the chamber of approximately 0.5 to 5 percent by volume.

15. The method of claim 12, wherein the impurity is a reactive gas and the impurity is flowed into the processing chamber to obtain an impurity concentration in the chamber of approximately 1 to 3 percent by volume.

16. The method of claim 12, wherein the oxidizing temperature is approximately 600 to 1,100 degrees Celsius.

17. A method for forming an oxide layer supported by a substrate, comprising the steps of:
    providing at least one substrate;
    incorporating an impurity selected from the group consisting of chlorine, fluorine, bromine, iodine, astatine, nitrogen trifluoride, and ammonia into the substrate at low pressure of approximately 50 to 100 psi;
    forming an oxide layer, using high pressure oxidation of greater than 100 psi and such that an interface between the substrate and the oxide layer contains an impurity selected from the group consisting of reactive gases and inert gases wherein forming the oxide layer comprises a higher pressure than incorporating the impurity.

18. The method of claim 17, wherein the interface contains the impurity is a reactive gas and the impurity is at a concentration of approximately $10^{17}$ to $10^{20}$ impurity atoms/cc.

19. A method for introducing an impurity into an oxide supported by a substrate, comprising the steps of:
    incorporating an impurity selected from the group consisting of chlorine, fluorine, bromine, iodine, astatine, nitrogen trifluoride, and ammonia into the substrate at low pressure of approximately 50 to 100 psi;
    oxidizing the substrate at high pressure after incorporating the impurity, wherein the high pressure is greater than 100 psi; and
    incorporating an impurity selected from the group consisting of chlorine, fluorine, bromine, iodine, astatine, nitrogen trifluoride, and ammonia into the oxide at low pressure of approximately 50 to 100 psi wherein the oxidizing comprises a higher pressure than when incorporating the impurity.

20. A method for introducing an impurity into an oxide supported by a substrate, comprising the steps of:

selecting an impurity from the group consisting of chlorine, fluorine, bromine, iodine, astatine, nitrogen trifluoride, and ammonia;

oxidizing the substrate at high pressure to form the oxide;

incorporating the impurity into the oxide at low pressure of 50 to 100 psi, wherein the oxidizing step comprises a higher pressure than the incorporating step; and heating the substrate at least after incorporating the impurity.

21. A method for introducing an impurity into an oxide supported by a substrate, comprising the steps of:

selecting impurity from the group consisting of chlorine, fluorine, bromine, iodine, astatine, nitrogen trifluoride, and ammonia;

oxidizing the substrate at high pressure to form the oxide;

incorporating the impurity into the oxide at low pressure of 50 to 100 psi, wherein oxidizing the substrate at high pressure comprises a pressure greater than 100 psi; and heating the substrate at least after incorporating the impurity.

* * * * *